United States Patent
Zhang et al.

(10) Patent No.: US 9,356,053 B2
(45) Date of Patent: May 31, 2016

(54) THIN FILM TRANSISTOR ARRAY SUBSTRATE AND DRIVING METHOD THEREFOR AS WELL AS LIQUID CRYSTAL DISPLAY

(71) Applicants: BOE TECHNOLOGY GROUP CO., LTD., Beijing (CN); BEIJING BOE DISPLAY TECHNOLOGY CO., LTD., Beijing (CN)

(72) Inventors: Bin Zhang, Beijing (CN); Liang Zhang, Beijing (CN); Weihao Hu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 155 days.

(21) Appl. No.: 14/123,669

(22) PCT Filed: Dec. 3, 2012

(86) PCT No.: PCT/CN2012/085762
§ 371 (c)(1),
(2) Date: Dec. 3, 2013

(87) PCT Pub. No.: WO2014/005395
PCT Pub. Date: Jan. 9, 2014

(65) Prior Publication Data
US 2014/0368480 A1    Dec. 18, 2014

(30) Foreign Application Priority Data
Jul. 6, 2012    (CN) .......................... 2012 1 0236108

(51) Int. Cl.
*H01L 27/12*    (2006.01)
*G09G 3/36*    (2006.01)
*G02F 1/1362*    (2006.01)

(52) U.S. Cl.
CPC ...... *H01L 27/1255* (2013.01); *G02F 1/136213* (2013.01); *G09G 3/3648* (2013.01);
(Continued)

(58) Field of Classification Search
CPC combination set(s) only.
See application file for complete search history.

(56) References Cited

U.S. PATENT DOCUMENTS 8,299,994 B2 *    10/2012    Wang et al. ..................... 345/89
2002/0154253 A1 *    10/2002    Cairns et al. .................... 349/43
(Continued)

FOREIGN PATENT DOCUMENTS

CN    1372242 A    10/2002
CN    102778796 A    11/2012
(Continued)

OTHER PUBLICATIONS

Office Action (Chinese language) issued by the State Intellectual Property Office ("SIPO") for application No. 201210236108.1 on Sep. 17, 2014, 7 pages.
(Continued)

*Primary Examiner* — Kumar Patel
*Assistant Examiner* — Amy C Onyekaba
(74) *Attorney, Agent, or Firm* — Ladas & Parry LLP

(57) ABSTRACT

A thin film transistor array substrate, a driving method therefore, and a liquid crystal display are disclosed. The thin film transistor array substrate includes at least a sub-pixel region formed by a gate line and a data line intersected with each other, wherein, each sub-pixel comprises a first transistor (21) of which the gate is connected with a gate line and the drain is connected with a data line and a first storage capacitor (23) of which one end is connected with the source of the first transistor (21) and the other end is connected with an output of a reference voltage, the sub-pixel further comprises a second storage capacitor (24) and a second transistor (25), wherein one end of the second storage capacitor (24) is connected with the source of the first transistor (21), and the other end of the second storage capacitor (24) is connected with the drain of the second transistor (25); the source of the second transistor (25) is connected with the output of the reference voltage, and the gate of the second transistor (25) is connected with an output of an Enable signal. Since a second storage capacitor (24) is additionally added to each sub-pixel in the thin film transistor array substrate, the capacitance of the storage capacitors during static display is increased, the voltage conversion frequency during static display is deceased, and the system power consumption is decreased.

5 Claims, 3 Drawing Sheets

(52) U.S. Cl.
CPC ...... *G09G3/3696* (2013.01); *G09G 2300/0852* (2013.01); *G09G 2320/10* (2013.01); *G09G 2330/021* (2013.01); *G09G 2340/0435* (2013.01)

(56) References Cited

U.S. PATENT DOCUMENTS

2012/0113080 A1    5/2012    den Boer
2012/0169954 A1*   7/2012    Liu ................................. 349/38

FOREIGN PATENT DOCUMENTS

EP    1239323 A1      9/2002
JP    2008-158189 A   7/2008

OTHER PUBLICATIONS

English translation of Office Action for application No. 201210236108.1, listed above, 7 pages.

International Preliminary Report on Patentability issued by the International Bureau of WIPO on Jan. 6, 2015 for International Application No. PCT/CN2012/085762, 8 pages.

The State Intellectual Property Office of the People's Republic of China ("SIPO") (Chinese Language) Third Office Action issued on Feb. 2, 2015 by SIPO in Chinese Patent Application No. 201210236108.1; eight (8) pages.

English Translation of The State Intellectual Property Office of the People's Republic of China ("SIPO") (Chinese Language) Third Office Action issued on Feb. 2, 2015 by SIPO in Chinese Patent Application No. 201210236108.1; eight (8) pages.

International Search Report for International Application No. PCT/CN2012/085762 issued Mar. 27, 2013, 13pgs.

First Office Action issued by the Chinese Patent Office for Chinese Patent Application No. 2012102361081 dated May 23, 2014, 6pgs.

English translation of First Office Action issued by the Chinese Patent Office for Chinese Patent Application No. 2012102361081 dated May 23, 2014, 4pgs.

Chinese Rejection Decision dated May 5, 2015; Appln. No. 201210236108.1.

Supplementary European Search Report dated Feb. 4, 2016; Appln. No. EP 12 88 0654.

* cited by examiner

THIN FILM TRANSISTOR ARRAY SUBSTRATE AND DRIVING METHOD THEREFOR AS WELL AS LIQUID CRYSTAL DISPLAY

CROSS REFERENCE TO RELATED APPLICATIONS

This application is based on International Application No. PCT/CN2012/085762 filed on Dec. 3, 2012, which claims priority to Chinese National Application No. 201210236108.1 filed on Jul. 6, 2012, the contents of which are incorporated herein by reference.

TECHNICAL FIELD

The present invention relates to a thin film transistor (TFT) array substrate and a driving method therefor as well as a liquid crystal display (LCD).

BACKGROUND

With the continuing development of the LCD technology, the LCD with small size, low power consumption, no radiation and the like has gradually replaced the cathode ray tube (CRT) display, and becomes the mainstream product among display devices.

Nowadays, the LCD typically has a TFT array substrate structure as shown in FIG. 1. The TFT array substrate includes at least one sub-pixel region formed with a gate line (G) and a data line (D) intersected with each other (taking the structure schematic diagram of the TFT array substrate shown in FIG. 1 as an example, a sub-pixel region is formed when $G_1$, $G_2$, $D_1$ and $D_2$ are intersected with each other, and likewise, a sub-pixel region is formed as well when $G_N$, $G_{N+1}$, $D_N$ and $D_{N+1}$ are intersected with each other.) The sub-pixel corresponding to each sub-pixel region comprises a transistor 11, a liquid crystal capacitor 12, and a storage capacitor 13. The gate of the transistor 11 is connected with a gate line, and the drain of the transistor 11 is connected with a data line; one end of the liquid crystal capacitor 12 is connected with the source of the transistor 11, and the other end of the liquid crystal capacitor 12 is connected with the output (denoted as 'a') of a reference voltage (Vcom); and one end of the storage capacitor 13 is connected with the source of the transistor 11, and the other end of the storage capacitor 13 is connected with the output of the reference voltage.

The sub-pixel region on which the transistor 11 is placed is activated for display when a driving voltage is loaded onto the transistor 11 through the data line.

Currently, in order to ensure the image continuity of each sub-pixel of the LCDs during the dynamic image display, the LCDs mostly change the driving voltage once per 60 Hz (i.e., the voltage conversion frequency is 60 Hz) to realize the AC drive of the sub-pixel. Even if each sub-pixel of the LCD is in the static image display, the voltage conversion frequency is fixed at 60 Hz.

However, since the LCD power consumption generated during driving each sub-pixel of the LCD for image display is proportional to the driving voltage, the voltage conversion frequency of the driving voltage, and the parasitic capacitance on the LCD data line, the LCD will produce high static power consumption because of the high voltage conversion frequency when each sub-pixel of the LCD is in the static display mode.

SUMMARY

The embodiments of the invention provide a TFT array substrate and a driving method therefor as well as a liquid crystal display.

In one aspect of the present invention, it provides a TFT array substrate including at least one sub-pixel region formed by a gate line and a data line intersected with each other, wherein, a sub-pixel corresponding to each of at least one sub-pixel region comprises a first transistor of which the gate is connected with a gate line and the drain is connected with a data line and a first storage capacitor of which one end is connected with the source of the first transistor and the other end is connected with an output of a first reference voltage, the sub-pixel further comprises a second storage capacitor and a second transistor, wherein one end of the second storage capacitor is connected with the source of the first transistor, and the other end of the second storage capacitor is connected with the drain of the second transistor; the source of the second transistor is connected with an output of a second reference voltage, and the gate of the second transistor is connected with an output (denoted as 'b') of an Enable signal.

For example, the second transistor is a metal oxide semiconductor field effect transistor (MOSFET). For example, the first reference voltage and the second reference voltage are the same reference voltage, e.g., Vcom.

In another aspect of the present invention, it provides a LCD, wherein the LCD includes the above-mentioned TFT array substrate.

In still another aspect of the present invention, it provides a method for driving the above-mentioned TFT array substrate. The method includes: the output of the Enable signal inputs a first Enable signal to the gate of the second transistor for setting the second transistor into an open circuit state when the sub-pixel in the TFT array substrate performs dynamic image display; and the output of the Enable signal inputs a second Enable signal to the gate of the second transistor for setting the second transistor into a conducting state when the sub-pixel in the TFT array substrate performs static image display.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, and thus are not limitative of the invention.

DETAILED DESCRIPTION

The technical solutions of the embodiments of the present invention will be described in a clearly and fully understandable way in connection with the drawings related to the embodiments of the invention. It is obvious that the described embodiments are just a part but not all of the embodiments of the invention. According to the embodiments of the invention, all other embodiments obtained by those ordinary skilled in the art under the premise of without creative efforts are all intend to be within the scope of the invention.

Since the LCD power consumption generated during driving each sub-pixel of the TFT array substrate of the LCD for image display is proportional to the driving voltage, the voltage conversion frequency of the driving voltage, and the parasitic capacitance on the data line of the LCD, and the driving voltage and the parasitic capacitance on the data line of the LCD is determined by the characteristics of the liquid crystal of the LCD, which means that the driving voltage of the LCD and the parasitic capacitance on the data line of the LCD are determined when the LCD is determined, in order to decrease the static power consumption generated during each sub-pixel in the TFT array substrate of the LCD performing static image display, a new TFT array substrate is provided in the embodiments of the present invention, which achieves the effects of increasing the capacitance of the storage capacitor of each sub-pixel to decrease the voltage conversion frequency by providing an additional storage capacitor and a transistor for controlling the switching of the additional storage capacitor in each sub-pixel of the TFT array substrate.

A further description of the embodiments of the present invention will be made by reference to the accompanying drawings. However, the present invention is not limited to the following embodiments.

Embodiment 1

Figure 1:
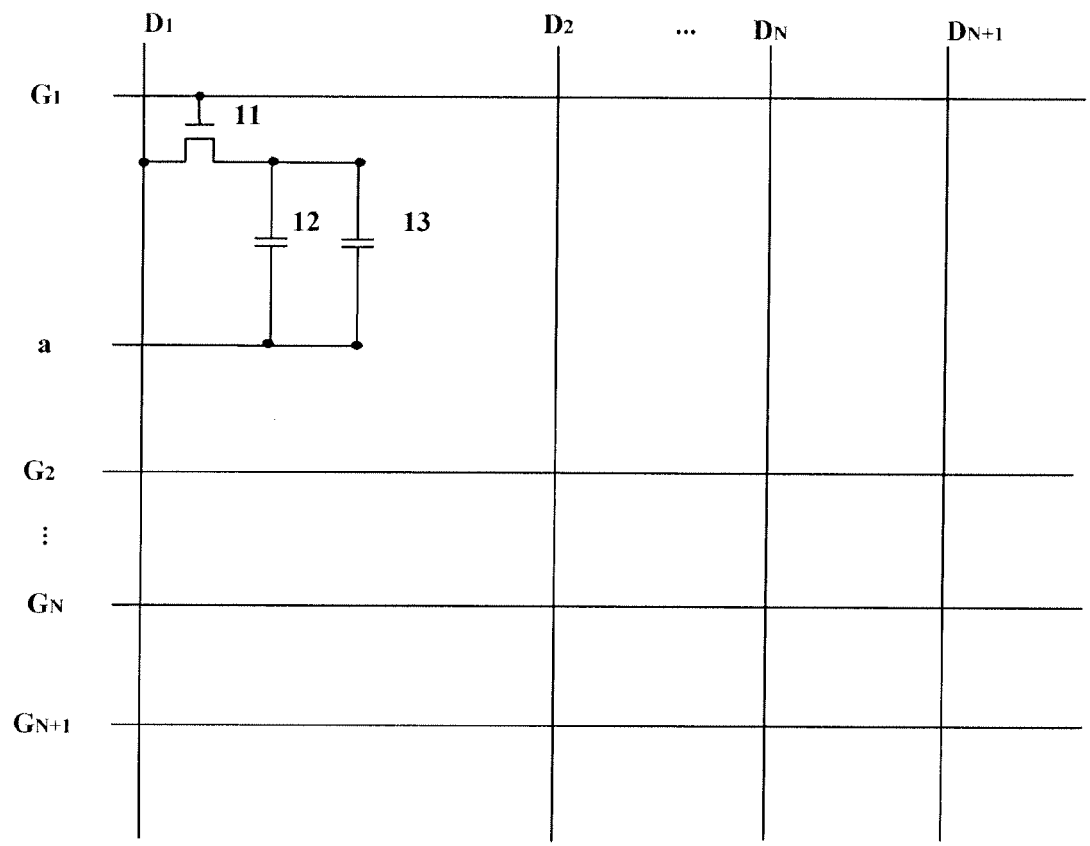
FIG. 1 is a schematic diagram of the TFT array substrate structure in the prior art.
Figure 2:
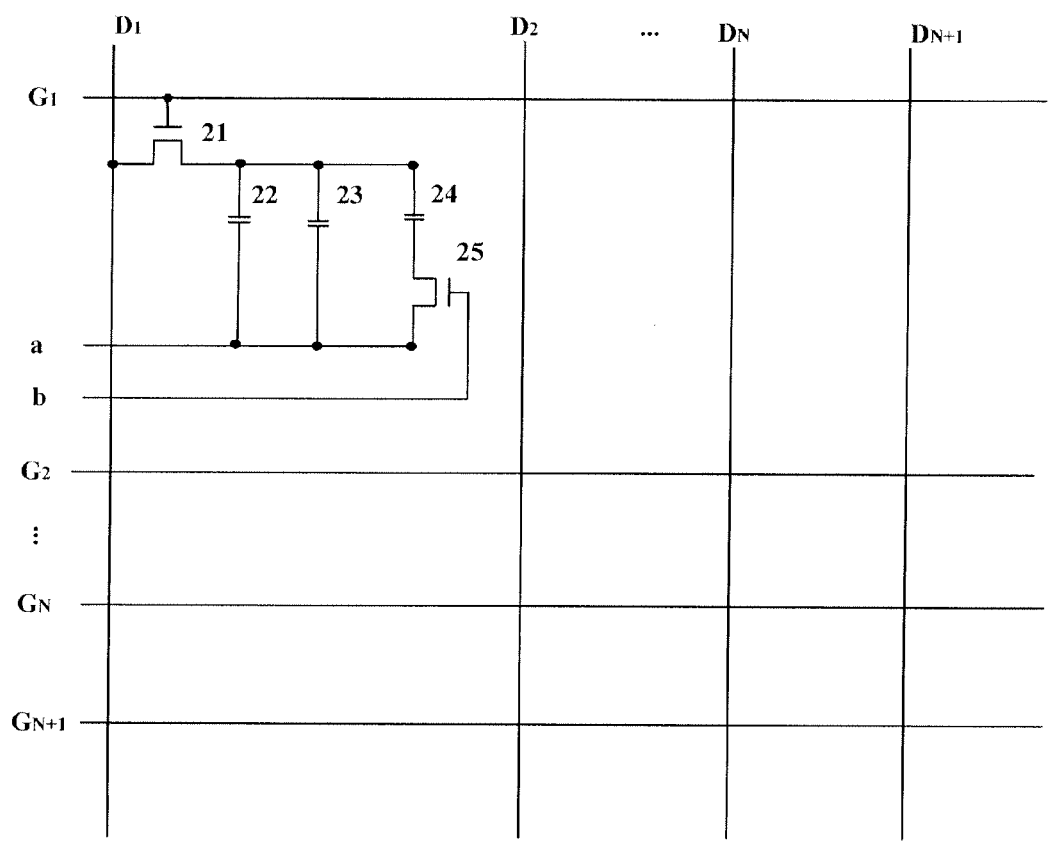
FIG. 2 is a schematic diagram of the TFT array substrate structure in an embodiment of the present invention.

As shown in FIG. 2, it is the structure schematic diagram of the TFT array substrate in the embodiment 1 of the present invention. The TFT array substrate includes at least one sub-pixel region formed by a gate line and a data line intersected with each other (taking the structure schematic diagram of the TFT array substrate shown in FIG. 2 as an example, a sub-pixel region is formed when $G_1$, $G_2$, $D_1$ and $D_2$ are intersected with each other, and likewise, a sub-pixel region is also formed when $G_N$, $G_{N+1}$, $D_N$ and $D_{N+1}$ are intersected with each other), wherein, the sub-pixel corresponding to each sub-pixel region includes a first transistor 21 of which the gate is connected with a gate line and the drain is connected with a data line, and a first storage capacitor 23 of which one end is connected with the source of the first transistor and the other end is connected with an output (denoted as 'a') of a first reference voltage, and the sub-pixel further includes a second storage capacitor 24 and a second transistor 25, wherein:

one end of the second storage capacitor 24 is connected with the source of the first transistor 21, and the other end of the second storage capacitor is connected with the drain of the second transistor 25; the source of the second transistor 25 is connected with an output of a second reference voltage, and the gate of the second transistor 25 is connected with the output (denoted as 'b') of the Enable signal.

The first and the second reference voltages may be different reference voltages or the same reference voltage, e.g., Vcom.

For example, the capacitance of the first storage capacitor 23 and the second storage capacitor 24 can be set according to the actual situation, but there is not any limitation to this in the embodiment of the invention. On the other hand, the first transistor 21 and the second transistor 25 can be switching tubes, such as, Metal Oxide Semiconductor Field Effect Transistor (MOSFET), including PMOSFET and NMOSFET, and Thin Film Transistors (TFT). For example, it may be NMOSFET.

For example, the second transistor 25 is used to control the switching of the second storage capacitor 24, and the second transistor 25 is a NMOSFET. The second transistor 25 is in a conducting state when the Enable signal outputted by the output of the Enable signal is at a high level. At this time, the second storage capacitor 24 and the first storage capacitor 23 are connected in parallel. Taking the TFT array substrate shown in FIG. 2 as an example, the capacitance of the storage capacitors of the sub-pixel corresponding to the sub-pixel region formed by intersecting $G_1$, $G_2$, $D_1$, and $D_2$ to each other would be the sum of the capacitance of the first storage capacitor 23 and that of the second storage capacitor 24. At this time, the voltage conversion frequency of the LCD driving voltage is decreased accordingly since the capacitance of the storage capacitors is increased. Taking the voltage conversion frequency of 60 Hz in the prior art as an example, the decreased voltage conversion frequency can be of 6-10 Hz. Further, the second transistor 25 is in an open circuit state when the Enable signal outputted by the output of the Enable signal is at a low level. At this time, still taking the TFT array substrate shown in FIG. 2 as an example, the capacitance of the storage capacitors of the sub-pixel corresponding to the sub-pixel region formed by intersecting $G_1$, $G_2$, $D_1$ and $D_2$ to each other would be only the capacitance of the first storage capacitor 23. Under this circumstance, the voltage conversion frequency of the LCD driving voltage would remain unchanged since the capacitance of the storage capacitors is the same as the capacitance of the storage capacitor of each sub-pixel in the TFT array substrate in the prior art.

Further, the Enable signal outputted by the output of the enable signal is controlled by a timing controller (ICON).

Since the higher the capacitance of the storage capacitors, the lower the voltage conversion frequency of the LCD driving voltage, and the lower the voltage conversion frequency, the lower the LCD static power consumption. Therefore, in the embodiment 1 of the present invention, in order to decrease the static power consumption generated during performing the static image display by each sub-pixel in the TFT array substrate of the LCD, and to ensure the image continuity during performing the dynamic image display by each sub-pixel at the same time, it is required that the Enable signal outputted by the output of the Enable signal corresponding to the second transistor 25 of the sub-pixel is the first Enable signal which enables the second transistor 25 to be set in the open circuit state (for example, the first Enable signal can be at the low level when the second transistor is a NMOSFET) when the sub-pixel of the TFT array substrate performs dynamic image display, and moreover, the Enable signal outputted by the output of the Enable signal corresponding to the second transistor 25 of the sub-pixel is the second Enable signal which enables the second transistor 25 to be set in the conducting state (for example, the second Enable signal can be at the high level when the second transistor is a NMOSFET) when the sub-pixel performs static image display.

Figure 3:
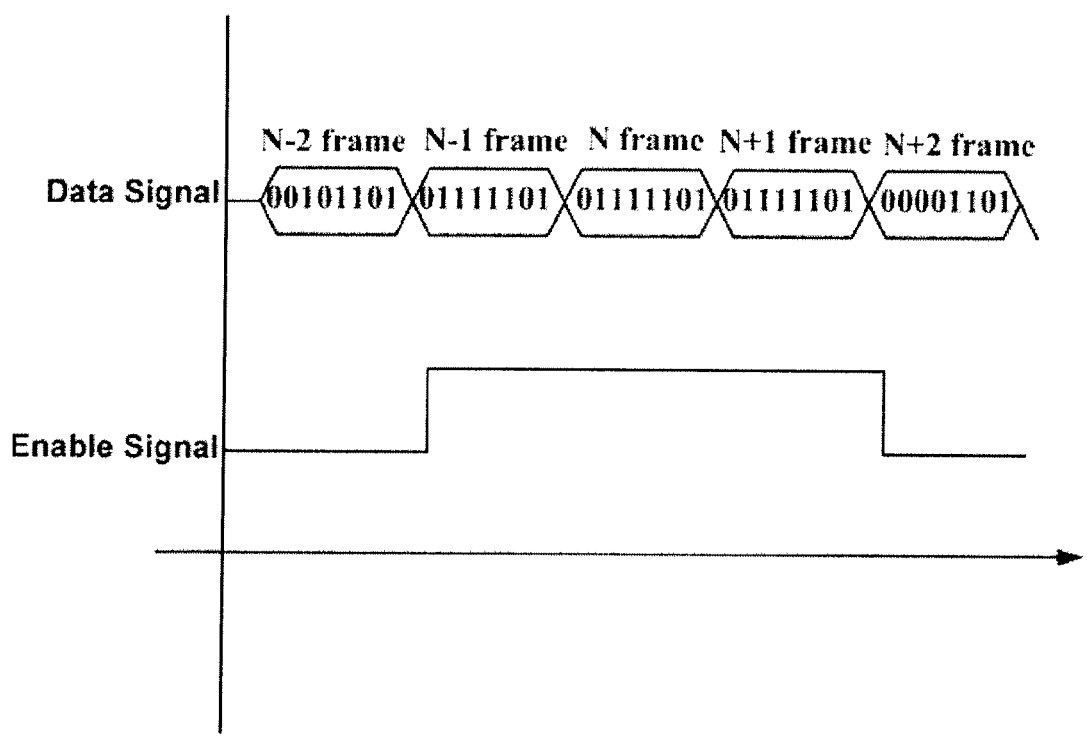
FIG. 3 is a schematic diagram of the signal drive of the TFT array substrate in an embodiment of the present invention.

For example, the second transistor is a NMOSFET. Taking the signal driving schematic diagram of the TFT array substrate shown in FIG. 3 as an example, the Data signals on the data line between frames (such as, frame N−1, frame N, and frame N+1) are the same when the sub-pixel of the TFT array substrate performs static image display. At this time, in order to decrease the static power consumption generated during static image display performed by each sub-pixel, the Enable signals outputted by the output of the Enable signal are all at the high level. When the sub-pixel of the TFT array substrate performs dynamic image display, the data on the data line between frames (such as, between frame N+1 and frame N+2, or between frame N−2 and frame N−1) are different. At this time, in order to ensure the image continuity during dynamic image display performed by each sub-pixel, the Enable signal outputted by the output of the Enable signal is at the low level.

Further, the TFT array substrate also includes a liquid crystal capacitor 22 of which one end is connected with the drain of the first transistor 21 and the other end is connected with the output of Vcom. For example, the capacitance of the liquid crystal capacitor 22 is determined by the characteristics of the liquid crystal of the LCD, and the capacitance of the liquid crystal capacitor 22 is usually small.

It is needed to be explained that, in the TFT array substrate described in the embodiment 1, each sub-pixel may comprise several branches, each of which is formed by the second storage capacitor 24 connected with the second transistor 25 in series and is connected with the first storage capacitor 23 in parallel. There is not any limitation for this in the embodiments of the invention. In addition, for any one branch which is formed by the second storage capacitor 24 connected with the second transistor 25 in series and is connected with the first storage capacitor 23 in parallel, the branch may also comprise several second storage capacitors 24 and/or second transistors 25. There is not any limitation for this in the embodiments of the invention.

A TFT array substrate is provided in the embodiment 1 of the present invention. In the TFT array substrate, each sub-pixel comprises a first transistor of which the gate is connected with a gate line and the drain is connected with the data line, and a first storage capacitor of which one end is connected with the source of the first transistor and the other end is connected with the output of Vcom. At the same time, each sub-pixel also comprises a second storage capacitor and a second transistor, wherein one end of the second storage capacitor is connected with the source of the first transistor and the other end of the second storage capacitor is connected with the drain of the second transistor; and the source of the second transistor is connected with the output of Vcom and the gate of the second transistor is connected with the output of the Enable signal. Since in the TFT array substrate of the embodiment 1 of the present invention, each sub-pixel is additionally provided with the second storage capacitor, the capacitance of the storage capacitors during static image display performed by each sub-pixel is increased, the voltage conversion frequency during static image display is decreased, and the effect of decreasing the system power consumption is achieved.

Embodiment 2

The embodiment 2 of the present invention provides a LCD. The LCD comprises the TFT array substrate described in the embodiment 1.

For example, in comparison to the existing LCD, in the TFT array substrate of the LCD described in the embodiment 2, each sub-pixel is additionally provided with both the second storage capacitor and the second transistor for controlling the switching of the second storage capacitor, wherein one end of the second storage capacitor is connected with the source of the first transistor in the TFT array substrate, the other end of the second storage capacitor is connected with the drain of the second transistor, and the source of the second transistor is connected with the output of Vcom and the gate of the second transistor is connected with the output of the Enable signal.

For example, when each sub-pixel in the TFT array substrate of the LCD of the embodiment 2 of the present invention performs dynamic image display, the Enable signal outputted by the output of the Enable signal corresponding to the second transistor of the sub-pixel is the first Enable signal for setting the second transistor into the open circuit state (for example, when the second transistor is a NMOSFET, the first Enable signal can be at the low level), and when the sub-pixel performs static image display, the Enable signal outputted by the output of the Enable signal corresponding to the second transistor of the sub-pixel is the second Enable signal for setting the second transistor into the conducting state (for example, when the second transistor is a NMOSFET, the second Enable signal can be at the high level). Therefore, the capacitance of each sub-pixel in the TFT array substrate of the LCD during the static display is increased, the voltage conversion frequency during the static display is decreased, and the effect of decreasing the system power consumption is achieved.

It is needed to be explained that in comparison to the existing LCD, all structural components other than the TFT array substrate of the LCD may remain unchanged in the LCD described in the embodiment 2 of the present invention.

Embodiment 3

The embodiment 3 of the present invention provides a method for driving the TFT array substrate described in the embodiment 1, which comprises:

when the sub-pixel in the TFT array substrate performs dynamic image display, the output of the Enable signal inputs the first Enable signal to the gate of the second transistor for setting the second transistor into the open circuit state (for example, when the second transistor is a NMOSFET, the first Enable signal can be at the low level); when the sub-pixel in the TFT array substrate performs static image display, the output of the Enable signal inputs the second Enable signal to the gate of the second transistor for setting the second Enable signal into the conducting state (for example, when the second transistor is a NMOSFET, the second Enable signal can be at the high level).

For example, the second transistor is a NMOSFET. When the output of the Enable signal inputs the Enable signal with the low level to the gate of the second transistor, the second transistor is in the open circuit state. At this time, taking the TFT array substrate shown in FIG. 2 as an example, the capacitance of the storage capacitors of the sub-pixel corresponding to the sub-pixel region formed by intersecting $G_1$, $G_2$, $D_1$ and $D_2$ to each other is only the capacitance of the first storage capacitor 23. At this time, the voltage conversion frequency of the driving voltage remains unchanged (it is usually 60 Hz in the prior art). Further, the second transistor 25 is in the conducting state when the Enable signal outputted by the output of the Enable signal to the gate of the second transistor is at the high level. At this time, the second storage capacitor 24 and the first storage capacitor 23 are connected in parallel. In still an example of the TFT array substrate shown in FIG. 2, the capacitance of the storage capacitors of the sub-pixel corresponding to the sub-pixel region formed by intersecting $G_1$, $G_2$, $D_1$ and $D_2$ to each other would be the sum of the capacitance of the first storage capacitor 23 and that of the second storage capacitor 24. At this time, since the capacitance of the storage capacitors is increased, the voltage conversion frequency of the LCD driving voltage is decreased accordingly. Taking the voltage conversion frequency of 60 Hz in the prior art as an example, the decreased voltage conversion frequency can be of 6-10 Hz.

For example, the Enable signal outputted by the output of the Enable signal can be controlled by a TCON. When the second transistor is a NMOSFET, taking the signal driving schematic diagram of the TFT array substrate shown in FIG. 3 as an example, Data signals on the data line between frames (such as, frames N-1, N and N+1) are the same when the sub-pixel of the TFT array substrate performs static image display. At this time, in order to decrease the static power consumption generated by each sub-pixel during the static display, TCON may control all Enable signals outputted by the output of the Enable signal to be at the high level according to the state of frames N−1, N and N+1 of the data signals on the data line. When the sub-pixel of the TFT array substrate performs dynamic image display, the data on the data line between frames (such as, between frame N+1 and frame N+2, or between frame N−2 and N−1) are different. At this time, in order to ensure the image continuity of each sub-pixel during dynamic image display, TCON may control the Enable signal outputted by the output of the Enable signal to be at the low level according to the state of frames N+1 and N+2 or frames N−2 and N−1 of the data signals on the data line.

The disclosed technical solution provides at least the following advantages:

(1) Since a second storage capacitor is additionally added to each sub-pixel, the capacitance of the storage capacitors during static display is increased;

(2) The voltage conversion frequency during static display is deceased; and (3) The system power consumption during static image display is decreased.

The above description is only the exemplary embodiments of the present invention, but not used to limit the scope of the present invention, which should be determined by the attaching claims.

What is claimed is:

1. A thin film transistor array substrate, comprising at least a sub-pixel region formed by a gate line and a data line intersected with each other,
   wherein, a sub-pixel corresponding to each sub-pixel region comprises a first transistor of which a gate of the first transistor is connected with a gate line and a drain of the first transistor is connected with a data line, and
   a first storage capacitor of which one end is connected with a source of the first transistor and the other end is connected with an output of a reference voltage,
   wherein the sub-pixel further comprises at least one branch connected in parallel with the first storage capacitor, each branch including a second storage capacitor and a second transistor connected in series,
   wherein: one end of the second storage capacitor is connected with the source of the first transistor, and the other end of the second storage capacitor is connected with a drain of the second transistor; a source of the second transistor is connected with an output of the reference voltage, and the gate of the second transistor is connected with an output of an Enable signal,
   wherein the timing controller (TCON) controls the output of the Enable signal to output a first Enable signal, which sets the second transistor in an open circuit state, based on a condition that data on the data line between two adjacent frames are different so as to keep a voltage conversion frequency of a driving voltage stable if the sub-pixel in the thin film transistor array substrate is in dynamic image display; and the timing controller (TCON) controls the output of the Enable signal to output a second Enable signal, which sets the second transistor in a conducting state, based on a condition that data on the data line between two adjacent frames are the same so as to decrease the voltage conversions frequency of the driving voltage if the sub-pixel in the thin film transistor array substrate is in static image display.

2. The thin film transistor array substrate of claim 1, wherein the second transistor is a metal oxide semiconductor field effect transistor.

3. A liquid crystal display comprising the thin film transistor array substrate of claim 2.

4. A liquid crystal display comprising the thin film transistor array substrate of claim 1.

5. The method in claim 1, wherein the driving voltage conversion frequency of the sub-pixel is from 6 to 10 Hz when each sub-pixel of the thin film transistor array substrate performs static image display.

* * * * *